(12) United States Patent
Hikmet et al.

(10) Patent No.: US 12,119,619 B2
(45) Date of Patent: Oct. 15, 2024

(54) HIGH-INTENSITY COLOR TUNABLE WHITE LASER LIGHT SOURCE USING GREEN PHOSPHOR

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING, B.V., Eindhoven (NL)

(*) Notice: Subject to any disclaimer, the term of this patent is extended or adjusted under 35 U.S.C. 154(b) by 279 days.

(21) Appl. No.: 17/762,401

(22) PCT Filed: Sep. 28, 2020

(86) PCT No.: PCT/EP2020/077088
§ 371 (c)(1),
(2) Date: Mar. 22, 2022

(87) PCT Pub. No.: WO2021/063878
PCT Pub. Date: Apr. 8, 2021

(65) Prior Publication Data
US 2022/0368112 A1 Nov. 17, 2022

(30) Foreign Application Priority Data
Oct. 1, 2019 (EP) .................................. 19200870

(51) Int. Cl.
*F21K 9/64* (2016.01)
*F21K 9/69* (2016.01)
(Continued)

(52) U.S. Cl.
CPC .............. *H01S 5/4012* (2013.01); *F21K 9/64* (2016.08); *F21K 9/69* (2016.08); *H01S 5/0611* (2013.01);
(Continued)

(58) Field of Classification Search
CPC .............. F21Y 2105/12; F21Y 2113/00; F21Y 115/30; F21Y 113/10; F21K 9/64;
(Continued)

(56) References Cited

U.S. PATENT DOCUMENTS

2005/0270775 A1 12/2005 Harbers et al.
2007/0223219 A1 9/2007 Medendorp et al.
(Continued)

FOREIGN PATENT DOCUMENTS

CN 101625513 A 1/2010
DE 102008011866 A1 9/2009
(Continued)

*Primary Examiner* — William J Carter

(57) ABSTRACT

The invention provides a light generating device (1000) configured to generate device light (1001), wherein the light generating device (1000) comprises: a first light source (110) configured to generate one or more of UV and blue first light source light (111), wherein the first light source (110) is a first laser light source (10); a second light source (120) configured to generated green second light source light (121), wherein the second light source (120) is a second laser light source (20); a third light source (130) configured to generate red third light source light (131), wherein the third light source (130) is a third laser light source (30); a fourth light source (140) configured to generate blue fourth light source light (141), wherein the fourth light source (140) is a fourth laser light source (40); a first luminescent material (210) configured to convert at least part of the first light source light (111) into first luminescent material light (211) having an emission band having wavelengths in one or more of (a) the green spectral wavelength range and (b) the yellow spectral wavelength range, wherein the first luminescent material (210) comprises a luminescent material of the type A3B5O12:Ce, wherein A comprises one or more of Y, La, Gd, Tb and Lu, and wherein B comprises one or more of Al, Ga, In and Sc; an optical element (430) configured to
(Continued)

combine (i) optionally unconverted first light source light (111), (ii) the second light source light (121), (iii) the third light source light (131), (iv) the fourth light source light (141), and (v) the first luminescent material light (211), to provide device light (1001), wherein the light generating device (1000) is configured to provide in an operational mode white device light (1001) comprising at least the luminescent material light (211) and the fourth light source light (141); and a control system (300) configured to control one or more of the light sources (110, 120, 130, 140).

15 Claims, 4 Drawing Sheets

(51) Int. Cl.
  *F21Y 113/10* (2016.01)
  *F21Y 115/30* (2016.01)
  *H01S 5/06* (2006.01)
  *H01S 5/40* (2006.01)
(52) U.S. Cl.
  CPC ........ *F21Y 2113/10* (2016.08); *F21Y 2115/30* (2016.08)
(58) Field of Classification Search
  CPC .... F21K 9/00; F21K 9/69; F21S 41/16; F21S 41/176
  See application file for complete search history.

(56) References Cited

U.S. PATENT DOCUMENTS

| | | | |
|---|---|---|---|
| 2011/0292349 A1* | 12/2011 | Kitano | G03B 21/2013 353/31 |
| 2013/0050654 A1 | 2/2013 | Hu et al. | |
| 2013/0215397 A1* | 8/2013 | Matsubara | F21V 13/12 353/57 |
| 2014/0268698 A1* | 9/2014 | Zimmerman | F21K 9/64 362/183 |
| 2015/0002824 A1* | 1/2015 | Kasugai | H04N 9/3182 353/31 |
| 2015/0341605 A1* | 11/2015 | Yamada | G02B 27/30 353/30 |
| 2016/0178141 A1* | 6/2016 | Bichler | F21S 10/02 362/84 |
| 2017/0356613 A1 | 12/2017 | Van Bommel et al. | |
| 2018/0106460 A1 | 4/2018 | Van Bommel et al. | |
| 2018/0316160 A1 | 11/2018 | Raring et al. | |
| 2019/0037185 A1 | 1/2019 | Tarpan et al. | |

FOREIGN PATENT DOCUMENTS

| | | |
|---|---|---|
| EP | 2985519 A1 | 2/2016 |
| EP | 3271013 A1 | 1/2018 |
| WO | 2007075661 A1 | 7/2007 |
| WO | 2015028334 A1 | 3/2015 |
| WO | 2019077020 A1 | 4/2019 |

* cited by examiner

HIGH-INTENSITY COLOR TUNABLE WHITE LASER LIGHT SOURCE USING GREEN PHOSPHOR

CROSS-REFERENCE TO PRIOR APPLICATIONS

This application is the U.S. National Phase application under 35 U.S.C. § 371 of International Application No. PCT/EP2020/077088, filed on Sep. 28, 2020, which claims the benefit of European Patent Application No. 19200870.8, filed on Oct. 1, 2019. These applications are hereby incorporated by reference herein.

FIELD OF THE INVENTION

The invention relates to a light generating device and to a luminaire comprising such light generating device.

BACKGROUND OF THE INVENTION

White light sources using a laser diode and phosphor are known in the art. US2018/0316160, for instance, describes a device and method for an integrated white colored electromagnetic radiation source using a combination of laser diode excitation sources based on gallium and nitrogen containing materials and light emitting source based on phosphor materials. A violet, blue, or other wavelength laser diode source based on gallium and nitrogen materials may be closely integrated with phosphor materials, such as yellow phosphors, to form a compact, high-brightness, and highly-efficient, white light source. The phosphor material is provided with a plurality of scattering centers scribed on an excitation surface or inside bulk of a plate to scatter electromagnetic radiation of a laser beam from the excitation source incident on the excitation surface to enhance generation and quality of an emitted light from the phosphor material for outputting a white light emission either in reflection mode or transmission mode.

SUMMARY OF THE INVENTION

While white LED sources can give intensity 300 lm/mm$^2$, static phosphor converted laser white sources can give 20,000 lm/mm$^2$. Ce doped garnets (YAG, LuAG) may be the most suitable luminescent convertors which can be used for pumping with blue laser light as garnet matrix has a very high chemical stability. Further, at low Ce concentrations (below 0.5%) temperature quenching may only occur above about 200° C. Furthermore, emission from Ce has a very fast decay time so that optical saturation can essentially be avoided. There appears to be a need for high intensity light sources which may have a tunable correlated color temperature (CCT) and/or which may have a relatively high (tunable) color rendering index (CRI). Especially, there appears to be a need for light sources which have a tunable correlated color temperature over a relatively large correlated color temperature range. Hence, it is an aspect of the invention to provide an alternative light generating device, which preferably further at least partly obviates one or more of above-described drawbacks. The present invention may have as object to overcome or ameliorate at least one of the disadvantages of the prior art, or to provide a useful alternative.

In a first aspect, the invention provides a light generating device ("device" or "lighting device") configured to generate device light ("light generating device light"). Especially, the light generating device comprises a first light source, a second light source, a third light source, a fourth light source, and a first luminescent material. The first light source is especially configured to generate one or more of UV and blue first light source light. In embodiments, the first light source may be a first laser light source. The second light source is especially configured to generated green second light source light. In embodiments, the second light source may be a second laser light source. Especially, the green second light source light has a second peak maximum $\lambda_2$ selected from the range of 535-575 nm, like especially 540-570 nm, such as 545-565 nm. The third light source may be configured to generate red third light source light. Especially, the third light source may be a third laser light source. The fourth light source may be configured to generate blue fourth light source light. Especially, the fourth light source is a fourth laser light source. The first luminescent material is especially configured to convert at least part of the first light source light into first luminescent material light having an emission band having wavelengths in one or more of (a) the green spectral wavelength range and (b) the yellow spectral wavelength range. In further specific embodiments, the first luminescent material may comprise a luminescent material of the type $A_3B_5O_{12}$:Ce, wherein A comprises one or more of Y, La, Gd, Tb and Lu, especially (at least) one or more of Y, Gd, Tb and Lu, and wherein B comprises one or more of Al, Ga, In and Sc. In specific embodiments, A comprises at least one or more of Y, Gd, and Lu. In specific embodiments, B comprises at least one or more of Al and Ga, even more especially at least Al. Further, in embodiments the light generating device may further comprise an optical element. The optical element may especially be configured to combine optionally unconverted first light source light, the second light source light, the third light source light, the fourth light source light, and the first luminescent material light, to provide device light. Yet further, the light generating device may in embodiments comprise a control system (or functionally be coupled to a control system). Especially, in embodiments the control system may be configured to control the one or more of the light sources, such as in embodiments at least the second light source. Especially, the light generating device may be configured to provide in an operational mode (of the light generating device) white device light comprising at least the luminescent material light and the fourth light source light. Therefore, in specific embodiments the invention provides a light generating device configured to generate device light, wherein the light generating device comprises: (i) a first light source configured to generate UV and/or blue first light source light, wherein the first light source is a first laser light source; (ii) a second light source configured to generated green second light source light, wherein the second light source is a second laser light source, and wherein the green second light source light has a second peak maximum $\lambda_2$ selected from the range of 545-565 nm; (iii) a third light source configured to generate red third light source light, wherein the third light source is a third laser light source; (iv) a fourth light source configured to generate blue fourth light source light, wherein the fourth light source is a fourth laser light source; (v) a first luminescent material configured to convert at least part of the first light source light into first luminescent material light having an emission band having wavelengths in one or more of (a) the green spectral wavelength range and (b) the yellow spectral wavelength range, wherein the first luminescent material comprises a luminescent material of the type $A_3B_5O_{12}$:Ce, wherein A comprises one or more of Y, La, Gd, Tb and Lu, especially (at least) one or more of Y, Gd, Tb and Lu, and wherein B comprises one or more of Al, Ga, In and Sc. In specific embodiments, A comprises at least one or more of Y, Gd, and Lu, and B comprises at least one or more of Al and Ga, even more especially at least Al; (vi) an optical element configured to combine (a1) optionally unconverted first light source light, (a2) the second light source light, (a3) the third light source light, (a4) the fourth light source light, and (a5) the first luminescent material light, to provide device light; and (vii) optionally a control system configured to control one or more of the light sources, especially at least the second light source, such as especially all light sources. Especially, the light generating device may be configured to provide in an operational mode (of the light generating device) white device light comprising at least the luminescent material light and the fourth light source light.

With such device it is possible to provide white light with a relatively high intensity and with a relatively broad range of correlated color temperature and with a relatively high color rendering index, such as at least 70, like even about 75. Further, the white light may be provided in a relatively efficient way with, in specific embodiments, a power loss of preferably less than 10% and more especially a power loss of 5% with respect to total power of the white light source. In this way a relatively efficient (white) light may be generated and/or with thermally stable components (white) light can be obtained.

As indicated above, the light generating device comprises a first light source configured to generate one or more of UV and blue first light source light. Hence, the first light source light may have a color point in the blue or may be UV radiation. Especially, the first light source comprises a first laser light source. The first laser light source is especially configured to generate first laser light source light. The first light source light may in embodiments essentially consist of the first laser light source light. Hence, in embodiments the first light source is a first laser light source. In embodiments, the term "first light source" may also refer to a plurality of the same first light sources. In embodiments, a bank of first laser light sources may be applied. Alternatively or additionally, the term "first light source" may also refer to a plurality of different first light sources. In embodiments, the term "first laser light source" may also refer to a plurality of the same first laser light sources. Alternatively or additionally, the term "first laser light source" may also refer to a plurality of different first laser light sources.

As indicated above, the light generating device comprises a second light source configured to generate green second light source light. Hence, the second light source light has a color point in the green. Especially, the second light source comprises a second laser light source. The second laser light source is especially configured to generate second laser light source light. The second light source light may in embodiments essentially consist of the second laser light source light. Hence, in embodiments the second light source is a second laser light source. In embodiments, the term "second light source" may also refer to a plurality of the same second light sources. In embodiments, a bank of second laser light sources may be applied. Alternatively or additionally, the term "second light source" may also refer to a plurality of different second light sources. In embodiments, the term "second laser light source" may also refer to a plurality of the same second laser light sources. Alternatively or additionally, the term "second laser light source" may also refer to a plurality of different second laser light sources.

As indicated above, the light generating device comprises a third light source configured to generate red third light source light. Hence, the third light source light has a color point in the red. Especially, the third light source comprises a third laser light source. The third laser light source is especially configured to generate third laser light source light. The third light source light may in embodiments essentially consist of the third laser light source light. Hence, in embodiments the third light source is a third laser light source. In embodiments, the term "third light source" may also refer to a plurality of the same third light sources. In embodiments, a bank of third laser light sources may be applied. Alternatively or additionally, the term "third light source" may also refer to a plurality of different third light sources. In embodiments, the term "third laser light source" may also refer to a plurality of the same third laser light sources. Alternatively or additionally, the term "third laser light source" may also refer to a plurality of different third laser light sources.

As indicated above, the light generating device comprises a fourth light source configured to generate blue fourth light source light. Hence, the fourth light source light has a color point in the blue. Especially, the fourth light source comprises a fourth laser light source. The fourth laser light source is especially configured to generate fourth laser light source light. The fourth light source light may in embodiments essentially consist of the fourth laser light source light. Hence, in embodiments the fourth light source is a fourth laser light source. In embodiments, the term "fourth light source" may also refer to a plurality of the same fourth light sources. In embodiments, a bank of fourth laser light sources may be applied. Alternatively or additionally, the term "fourth light source" may also refer to a plurality of different fourth light sources. In embodiments, the term "fourth laser light source" may also refer to a plurality of the same fourth laser light sources. Alternatively or additionally, the term "fourth laser light source" may also refer to a plurality of different fourth laser light sources.

In embodiments, laser light sources may be arranged in a laser bank. The laser bank may in embodiments comprise heat sinking and/or optics e.g. a lens to collimate the laser light. A laser bank may e.g. comprise at least 10, such as at least 20 laser light sources. In embodiments the laser bank may comprise first light sources. Alternatively or additionally, the laser bank may comprise second light sources. Alternatively or additionally, the laser bank may comprise third light sources. Alternatively or additionally, the laser bank may comprise fourth light sources.

Herein, the terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" and similar terms refer to light having one or more wavelengths in the range of about 380-780 nm.

Here below, some aspects in relation to the first light source, the second light source, the third light source, and the fourth light source are discussed. The first light source, the second light source, the third light source, and the fourth light source may be individually chosen and are thus not necessarily of the same type (notwithstanding the fact that the first/fourth, second, and third light sources are by definition different as the light source light generated by the first/fourth light source differs in spectral power distribution from the second light source light and from the third light source light). The first light source and the fourth light source may be of the same type, or may also be of different types. Hence, the spectral power distributions of the first light source light and fourth light source light may in embodiments be essentially the same or may in other embodiments be different. The spectral power distributions of the first light source light, the second light source light and the third light source light mutually differ. Likewise, the spectral power distributions of the second light source light, the third light source light, and the fourth light source light mutually differ.

In specific embodiments, colors or color points of a first type of light and a second type of light may be different when the respective color points of the first type of light and the second type of light differ with at least 0.01 for u' and/or with least 0.01 for v', even more especially at least 0.02 for u' and/or with least 0.02 for v'. In yet more specific embodiments, the respective color points of first type of light and the second type of light may differ with at least 0.03 for u' and/or with least 0.03 for v'. Here, u' and v' are color coordinate of the light in the CIE 1976 UCS (uniform chromaticity scale) diagram.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd:YVO$_4$) laser, neodymium glass (Nd:glass) laser, neodymium YLF (Nd:YLF) solid-state laser, promethium 147 doped phosphate glass (147Pm$^{3+}$:glass) solid-state laser, ruby laser (Al$_2$O$_3$:Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

As indicated above, in embodiments the first light source light may essentially consist of the laser light source light. In further specific embodiments, the first light source light may essentially consist of first laser light source light of one or more essentially identical laser light sources (such as from the same bin). Further, as indicated above, in embodiments the second light source light may essentially consist of the laser light source light. In further specific embodiments, the second light source light may essentially consist of second laser light source light of one or more essentially identical laser light sources (such as from the same bin). Further, as indicated above, in embodiments the third light source light may essentially consist of the laser light source light. In further specific embodiments, the third light source light may essentially consist of third laser light source light of one or more essentially identical laser light sources (such as from the same bin). In further specific embodiments, the fourth light source light may essentially consist of fourth laser light source light of one or more essentially identical laser light sources (such as from the same bin).

In specific embodiments, the first light source light may have a first peak maximum $\lambda_1$, wherein $\lambda_1$ is selected from the range of 200-480 nm. In embodiments, the first light source light may have a first peak maximum in the UV, such as selected from the range of 200-380 nm, especially 300-380 nm. Especially then, (the configuration may be chosen such that) conversion may essentially be 100%. In yet other embodiments, the first light source light may have a first peak maximum in the visible, such as selected from the same range as the fourth light source light, such as selected from the range of 450-480 nm, especially selected from the range of 460 nm±10 nm, especially 460 nm±5 nm, such as in specific embodiments 460 nm±2 nm. The wavelength around 460 nm appears surprisingly to provide, especially in combination with the first luminescent material light, the second light source light, the third light source light, and the fourth light source light, relatively high CRI and/or desirable color temperatures in a relatively efficient way. In embodiments wherein the first light source light has essentially the same spectral distribution as the fourth light source light, the light sources may (thus) be essentially the same, wherein the former are configured such that at least part of the first light source light is converted by the first luminescent material, and wherein the latter are configured such that essentially all fourth light source light bypasses the first luminescent material. For instance, the fourth light source may be configured downstream of the first luminescent material. When the first light source light has a peak maximum in the visible, conversion may be chosen to be essentially 100%. In this way, the device light may essentially not comprise first light source light. However, in other embodiments conversion may be chosen to be less than 100%. In such embodiments, optionally unconverted first light source light may be comprised in the device light.

In embodiments, the first light source includes one or more UV light sources and no blue light source(s). Some luminescent materials can be better pumped by a UV light source than by a blue light source.

In embodiments, the first light source include one or more blue light sources, and no UV light source(s). When only blue light sources are applied, the first light source and the fourth light source may essentially be identical. This may result in a more simple light engine (architecture). Hence, the first light source and the fourth light source may in embodiments be of the same bin. In embodiments, the first light source light and the fourth light source may have peak wavelengths within a wavelength range of about 20 nm. When the fourth light source light can be used to excite the first luminescent material, the fourth light source is especially configured to have its fourth light source light bypass the first luminescent material. In specific embodiments, the second light source light may have a second peak maximum $\lambda_2$, wherein $\lambda_2$ is selected from the range of 535-575 nm, like especially 540-570 nm, such as especially selected from the range of 545-565 nm, such as selected from the range of 545-560 nm, especially selected from the range of 550 nm±5 nm, such as in specific embodiments 450 nm±2 nm. The wavelength around 550 nm appears surprisingly to provide, especially in combination with the first luminescent material light, the optional first light source light, the third light source light, and the fourth light source light, relatively high CRI and/or desirable color temperatures in a relatively efficient way. In specific embodiments, the third light source light may have a third peak maximum $\lambda_3$, wherein $\lambda_3$ is selected from the range of 615-645 nm, like especially 630-650 nm, such as especially selected from the range of 630 nm±5 nm, such as in specific embodiments 630 nm±2 nm. The wavelength around 630 nm appears surprisingly to provide, especially in combination with the first luminescent material light, the first light source light, and the second light source light, and the fourth light source light, relatively high CRI and/or desirable color temperatures in a relatively efficient way. In specific embodiments, the fourth light source light may have a peak maximum $\lambda_1$, wherein $\lambda_1$ is selected from the range of 450-480 nm. In embodiments, the fourth light source light may have a peak maximum $\lambda_4$ selected from the range of 450-480 nm, especially selected from the range of 460 nm±10 nm, especially 460 nm±5 nm, such as in specific embodiments 460 nm±2 nm. The wavelength around 460 nm appears surprisingly to provide, especially in combination with the first luminescent material light, the second light source light, the third light source light, and the optional first light source light, relatively high CRI and/or desirable color temperatures in a relatively efficient way. In case the first luminescent material can essentially not be excited by the fourth light source light, then the blue fourth light source can be used to impinge on the first luminescent material (though this is not necessarily the case).

As indicated above, the light generating device especially further comprises a first luminescent material configured to convert at least part of the first light source light into first luminescent material light having an emission band having wavelengths in one or more of (a) the green spectral wavelength range and (b) the yellow spectral wavelength range. As indicated below, there may be at least two types of embodiments in relation to the conversion. In one type of embodiments, the luminescent material converts part of the first light source light, whereby unconverted UV and/or blue first light source light may be available in the device light. In other type of embodiments, the luminescent material converts at least part of the first light source light of a subset of one or more first light sources, and first light source light of another subset of one or more light sources does essentially not interact with the first luminescent material, whereby unconverted UV and/or blue first light source light of the another subset of one or more light sources may be available in the device light; see further also below.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise down-converter luminescent material, i.e. radiation of a larger wavelength is converted into radiation with a smaller wavelength ($\lambda_{ex} > \lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials.

Especially, the first luminescent material is configured to convert part of the UV and/or blue first light source light into first luminescent material light having an emission band having wavelengths in one or more of the green and yellow. Further, especially the first luminescent material light has one or more wavelengths in the range of about 500-700 nm. Further, in specific embodiments the first luminescent material light has a full width half maximum (FWHM) of at least 50 nm, such as at least 75 nm, like in specific embodiments up to about 130 nm (at room temperature). A broad band may provide a higher CRI. Especially, the first luminescent material light has a color point in the green or yellow, especially in the yellow. Especially, in embodiments the first luminescent material light has a dominant wavelength ($\lambda_{d1}$) selected from the range of 540-580 nm, more especially selected from the range of 555-580 nm. Especially, at least 85% of the spectral power (in Watt) of the first luminescent material light, such as at least 90%, is within the range of 500-700 nm. Hence, especially the first luminescent material is configured to emit first luminescent material light at least having one or more wavelengths in the yellow.

Especially good results in terms of CRI and CCT range appear to be achievable with cerium doped garnet type materials. Hence, in specific embodiments the first luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In specific embodiments the luminescent material comprises $(Y_{x1-x2-x3}A'_{x2}Ce_{x3})_3(Al_{y1-y2}B'_{y2})_5O_{12}$, wherein $x1+x2+x3=1$, wherein $x3>0$, wherein $0<x2+x3<0.2$, wherein $y1+y2=1$, wherein $0\leq y2\leq 0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O.

As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga.

In embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3\leq0.1$, and wherein $0\leq y2\leq0.1$.

Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein $x1+x3=1$, and wherein $0<x3\leq0.2$, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3\leq0.2$, wherein $y1+y2=1$, wherein $0\leq y2\leq0.2$. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

In yet further embodiments, in addition to the first luminescent material, the light generating device may also comprise one or more further luminescent materials, especially configured to convert part of one or more of the first light source light and second light source light into further luminescent material light. Especially, in embodiments the light generating device may also comprise a second luminescent material, especially configured to convert part of one or more of the first light source light and second light source light into second luminescent material light. Further, especially the second luminescent material light has one or more wavelengths in the range of about 550-700 nm. Further, in specific embodiments the first luminescent material light has a full width half maximum (FWHM) of at least 25 nm, such as at least 40 nm, like in specific embodiments up to about 150 nm (at room temperature). Especially, the second luminescent material light has a color point in the orange. Especially, in embodiments the second luminescent material light has a dominant wavelength ($\lambda_{d1}$) selected from the range of 590-640 nm, especially selected from the range of 590-620 nm, more especially selected from the range of 595-615 nm. Especially, at least 50% of the spectral power (in Watt) of the first luminescent material light, such as at least 70%, is within the range of 550-650 nm. The second luminescent material light may e.g. have a dominant wavelength in the orange-red wavelength range. Examples of such second luminescent material may e.g. be $M_2Si_5N_8$:$Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. Hence, in embodiments the light generating device may further comprise a second luminescent material configured to convert part of one or more of the first light source light and second light source light into second luminescent material light.

Further, embodiments in relation to the first luminescent material may in general also apply to the second luminescent material. For instance, especially the optical element may (also) be configured to combine unconverted first light source light, the second light source light, the third light source light, the first luminescent material light and the second luminescent material light, to provide device light.

It may be desirable to (further) shape the device light into a beam of device light. Alternatively or additionally, it may be desirable to (further) homogenize the device light (into homogenized device light). To this end, an optical element may be used. Hence, in embodiments the light generating device may further comprise an optical element configured to beam shape the device light and/or configured to homogenize the device light. Especially, the optical element is configured downstream of the first luminescent material. Further, the optical element is configured downstream from one or more first light sources and downstream of the second light source. The optical element may especially comprise a collimator used to convert (to "collimate") the light beam into a beam having a desired angular distribution. Further, the optical element especially comprises a light transmissive body comprising the radiation entrance window. Hence, the optical element may be a body of light transmissive material that is configured to collimate the converter radiation from the luminescent body. In specific embodiments, the optical element comprises a compound parabolic like collimator, such as a CPC (compound parabolic concentrator). A massive collimator, such as a massive CPC, may especially be used as extractor of light and to collimate the (emission) radiation. Alternatively, one may also comprise a dome with optical contact (n>1.00) on the nose of the rod or a hollow collimator, such as a CPC, to concentrate the (emission) radiation.

The optical element may have cross section (perpendicular to an optical axis) with a shape that is the same as the cross-section of the luminescent body (perpendicular to the longest body axis (which body axis is especially parallel to a radiation input face). For instance, would the latter have a rectangular cross section, the former may also have such rectangular cross section, though the dimension may be different. Further, the dimension of the optical element may vary over its length (as it may have a beam shaping function).

Further, the shape of the cross-section of the optical element may vary with position along the optical axis. In a specific configuration, the aspect ratio of a rectangular cross-section may change, preferably monotonically, with position along the optical axis. In another preferred configuration, the shape of the cross-section of the optical element may change from round to rectangular, or vice versa, with position along the optical axis.

Especially, the optical element may (then) be configured to combine two or more of (i) optionally unconverted first light source light, (ii) the second light source light, (iii) the third light source light, (iv) the fourth light source light, (v)

the first luminescent material light, and the second luminescent material light to provide device light. In specific embodiments, the optical element may be configured to combine (i) optionally unconverted first light source light, (ii) the second light source light, (iii) the third light source light, (iv) the fourth light source light, (v) the first luminescent material light, and the second luminescent material light to provide device light. Hence, in embodiments the light generating device comprises an optical element configured to combine optionally unconverted first light source light, the second light source light, the third light source light, the fourth light source light, and the first luminescent material light, to provide device light. Note that the optical element may also be configured to combine two or more of these indicated lights. During operation of the light generating device, it is not necessary that all types of light are available. This may depend e.g. on the mode of operation, such as whether or not white light or whether or not colored light is provided, or it may depend upon the correlated color temperature.

In specific embodiments, the optical element may comprise one or more of (i) a dichroic beam combiner and (ii) an optical homogenizer. The dichroic beam combiner may in embodiments comprise a dichroic prism. A dichroic beam combiner may also be used to transmit a first type of light and to reflect a second type of light wherein tan optical axis of the transmitted first type of light and an optical axis of the second type of light may substantially coincide downstream of the dichroic beam combiner. Embodiments of a homogenizer are also indicated above. In embodiments, two or more dichroic beam combiners may be applied, for instance to introduce into the beam two or more of the second light source light, the third light source light and the fourth light source light. Hence, especially the dichroic beam combiner is configured downstream of the luminescent material. However, in other embodiments, one or more dichroic beam combiners may be configured upstream of the luminescent material and/or one or more dichroic beam combiners may be configured downstream of the luminescent material.

As further indicated above, the light generating device is especially configured to generate device light. In one or more operational modes of the light generating device the light generating device is configured to generate white device light comprising the fourth light source light, the first luminescent material light, the second light source light and the third light source light. Hence, in embodiments the light generating device may be configured to provide in an operational mode (of the light generating device) white device light comprising at least the luminescent material light and the fourth light source light.

Further, in specific embodiments the light generating device may comprise a control system configured to control one or more of the light sources. In specific embodiments, the light generating device may be comprise a control system configured to control the second light source. Especially control of at least the second light source may allow controlling the correlated color temperature of the device light. Therefore, in specific embodiments the control system may be configured to control the correlated color temperature by controlling the second light source. Especially, in embodiments the control system may be configured to control the correlated color temperature by controlling the second light source, and optionally one or more of (i) the third light source and (ii) the fourth light source, and optionally also the first light source. In yet other embodiments, the light generating device may be comprise a control system configured to control all the first light source, the second light source, the third light source, and the fourth light source. The system, or apparatus, or device may execute an action in a "mode" or "operation mode" or "mode of operation" or "operational mode". Likewise, in a method an action or stage, or step may be executed in a "mode" or "operation mode" or "mode of operation". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed. However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability). Hence, in embodiments, the control system may control in dependence of one or more of an input signal of a user interface, a sensor signal (of a sensor), and a timer. The term "timer" may refer to a clock and/or a predetermined time scheme. See further also below. Especially, there may be a plurality of modes of operation, such as at least two, like at least three, such as at least five, like at least 8, such as at least 16. A change between the modes of operation may be stepwise or stepless. Control can be analogical or digital. The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. . . . Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface. The control system may also be configured to receive and execute instructions form a remote control. In embodiments, the control system may be controlled via an App on a device, such as a portable device, like a smartphone, an iPhone, a tablet, etc. . . . The device is thus not necessarily coupled to the lighting system but may be (temporarily) functionally coupled to the lighting system. Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage. The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

In specific embodiments, all first light source light that is comprised by the device light is one or more of (i) reflected, (ii) scattered, and (iii) transmitted by the first luminescent material. With respect to the second light source, the second light source light may in embodiments (also) be one or more of (i) reflected, (ii) scattered, and (iii) transmitted by the first luminescent material (see further also below). However, in (other) embodiments the second light source light (also) does not have essentially any interaction with the first luminescent material, as it may be added with the luminescent material light, i.e. downstream of the first luminescent material. Hence, in specific embodiments the second light source is configured downstream of the first luminescent material, and the light generating device is configured to combine the second light source light and the first luminescent material light (downstream of the first luminescent material). To this end, also (optional) (second) optics may be applied, like a dichroic mirror (dichroic beam combiner). With respect to the third light source, the third light source light may in embodiments (also) be one or more of (i) reflected, (ii) scattered, and (iii) transmitted by the first luminescent material (see further also below). However, in (other) embodiments the third light source light (also) does not have essentially any interaction with the first luminescent material, as it may be added with the luminescent material light, i.e. downstream of the first luminescent material. Hence, in specific embodiments the third light source is configured downstream of the first luminescent material, and the light generating device is configured to combine the third light source light and the first luminescent material light (downstream of the first luminescent material). To this end, also (optional) optics may be applied, like a dichroic mirror (dichroic beam combiner). With respect to the fourth light source, the fourth light source light may in embodiments (also) be one or more of (i) reflected, (ii) scattered, and (iii) transmitted by the first luminescent material (see further also below). However, in (other) embodiments the fourth light source light (also) does not have essentially any interaction with the first luminescent material, as it may be added with the luminescent material light, i.e. downstream of the first luminescent material. Hence, in specific embodiments the fourth light source is configured downstream of the first luminescent material, and the light generating device is configured to combine the fourth light source light and the first luminescent material light (downstream of the first luminescent material). To this end, also (optional) optics may be applied, like a dichroic mirror (dichroic beam combiner). As indicated above, the second light source light and/or third light source light and/or fourth light source light may in embodiments be one or more of (i) reflected, (ii) scattered, and (iii) transmitted by the first luminescent material. For instance, in embodiments the first luminescent material may be transmissive for at least part of the second light source light and/or at least part of third light source light and/or at least part of fourth light source light. Especially, in embodiments the first luminescent material is transmissive for at least part of the second light source light. In embodiments, the first luminescent material may be comprised or be configured as a light transmissive body, such as in specific embodiments a light transparent body. In such embodiments, the second light source and/or third light source and/or the fourth light source may be configured upstream of the first luminescent material. Therefore, in specific embodiments the first luminescent material may be transmissive for at least part of the second light source light and/or at least part of third light source light and/or at least part of the fourth light source light, wherein the second light source and/or third light source and/or the fourth light source are configured upstream of the first luminescent material, and wherein during the one or more operational modes at least part of the second light source light and/or third light source light and/or the fourth light source light is transmitted through the first luminescent material to provide transmitted second light source light and/or third light source light and/or the fourth light source light, wherein in the one or more operational modes of the light generating device the light generating device is configured to generate (white) device light comprising the first luminescent material light, and the transmitted second light source light and/or transmitted third light source light and/or transmitted the fourth light source light. However, one or more of the second light source, the third light source, and the fourth light source may also be configured downstream of the first luminescent material. In this way the light source light of the one or more of the second light source, the third light source, and the fourth light source may bypass the first luminescent material. Having the first luminescent material transmit, scatter, or reflect may add to homogenization of the device light.

In specific embodiments, in the one or more operational modes of the light generating device the light generating device is configured to generate white device light comprising the first luminescent material light and/or the fourth light source, and (i) optionally one or more of the second light source light and the third light source light, and (ii) optionally visible first light source light.

In specific embodiments, at least part of the second light source light may be transmitted by the first luminescent material. Further, in embodiments at least part of the third light source light may bypass the first luminescent materials. Hence, in embodiments the second light source may be configured upstream of the first luminescent material, and the third light source may be configured to generate the third light source light that bypasses the first luminescent material.

Further, in embodiments at least part of the fourth light source light may bypass the first luminescent materials. Hence, the fourth light source may be configured to generate the fourth light source light that bypasses the first luminescent material. In embodiments, the second light source may be configured upstream of the first luminescent material. Therefore, in specific embodiments the fourth light source is configured to generate the fourth light source light that bypasses the first luminescent material, and wherein one or more of the second light source and the third light source are configured upstream of the first luminescent material.

Especially, in embodiments the light generating device may comprise a luminescent body, wherein the luminescent body comprises the first luminescent material. In such embodiments, it may also be possible to pump with a plurality of first light sources the luminescent body. This may further increase the output of the light generating device. Hence, in yet further specific embodiments the light generating device may comprise a plurality of first light sources, wherein the plurality of first light sources are configured to irradiate the luminescent body with the first light source light. Instead of the term "luminescent body", and similar terms, also the term "light transmissive body", and similar terms, may be applied, as the luminescent body is also transmissive for the first luminescent material light.

As indicated above, the light generating system especially comprises in embodiments a luminescent body. The luminescent body may comprise (N) side faces (over at least part of the length L), wherein N≥3. Hence, especially the luminescent body has a cross-sectional shape that is square (N=4), rectangular (N=4), hexagonal (n=6), or octagonal (n=8), especially rectangular. Would the luminescent body have a circular cross-section, N may be considered co.

The (elongated) body includes a first end or first face, in general configured perpendicular to one or more of the (n) side faces and a second end or second face, which may be configured perpendicular to one or more of the side faces, and thus parallel to the first face, but which also may be configured under an angle unequal to 90° and unequal to 180°. Hence, in embodiments in specific embodiments the radiation exit window has an angle unequal to 0° and unequal to 180° with one or more of the one or more side faces, especially all of the side faces. Note that the angle α may differ per for different side faces. For instance, a slanted radiation exit window of a bar shaped elongated body may have an angle of α1 with a first side face, an angle α2=180°−α1 with a second side face, and angles of 90° with the two other side faces. The (elongated) luminescent body may thus in embodiments include (n) side faces, which comprise a first side face, comprising a radiation input face, and a second side face configured parallel to the first side face, wherein the side faces define a height (H). The first and the second side face are configured parallel with luminescent body material in between, thereby defining the width of the luminescent body. The radiation input face is at least part of the first face which may be configured to receive the light source light. The (elongated) luminescent body further comprises a radiation exit window bridging at least part of the height (H) between the first side face and the second side face. Especially, the radiation exit window is comprised by the second face. Further embodiments are also elucidated below. As indicated above, in embodiments the radiation exit window and the radiation input face have an angle (α) unequal to 0° and unequal to 180°. Yet further, as also indicated above in embodiments the radiation exit window has an angle unequal to 0° and unequal to 180° with one or more of the one or more side faces.

The light transmissive body has light guiding or wave guiding properties. Hence, the light transmissive body is herein also indicated as waveguide or light guide. As the light transmissive body is used as light concentrator, the light transmissive body is herein also indicated as light concentrator. The light transmissive body will in general have (some) transmission of one or more of (N)UV, visible and (N)IR radiation, such as in embodiments at least visible light, in a direction perpendicular to the length of the light transmissive body. Without the activator (dopant) such as trivalent cerium, the internal transmission in the visible might be close to 100%.

The transmission of the light transmissive body for one or more luminescence wavelengths may be at least 80%/cm, such as at least 90%/cm, even more especially at least 95%/cm, such as at least 98%/cm, such as at least 99%/cm. This implies that e.g. a 1 cm$^3$ cubic shaped piece of light transmissive body, under perpendicular irradiation of radiation having a selected luminescence wavelength (such as a wavelength corresponding to an emission maximum of the luminescence of the luminescent material of the light transmissive body), will have a transmission of at least 95%. Hence, the luminescent body is herein also indicated "light transmissive body", as this body is light transmissive for the luminescent material light. Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses. In embodiments, an anti-reflection coating may be applied to the luminescent body, such as to suppress Fresnel reflection losses (during the light incoupling process). In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction. The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The light transmissive body may have any shape, such as beam (or bar) like or rod like, however especially beam like (cuboid like). The light transmissive body, such as the luminescent concentrator, might be hollow, like a tube, or might be filled with another material, like a tube filled with water or a tube filled with another solid light transmissive medium. The invention is not limited to specific embodiments of shapes, neither is the invention limited to embodiments with a single exit window or outcoupling face. Below, some specific embodiments are described in more detail. Would the light transmissive body have a circular cross-section, then the width and height may be equal (and may be defined as diameter). Especially, however, the light transmissive body has a cuboid like shape, such as a bar like shape, and is further configured to provide a single exit window.

In embodiments, one or more of the light source may be configured in a reflective configuration with the luminescent material. Further, in embodiments one or more of the light sources may be configured in a transmissive configuration.

Especially, in embodiments the solid state light source, or other light source, is not in (direct) physical contact with the light transmissive body.

Especially, in embodiments the light transmissive body comprises a radiation input face, configured in a light receiving relationship with the first light source, and a radiation exit face. Especially, in embodiments the radiation input face and the radiation exit face are not the same part of the light transmissive body, though it is not excluded that the same face may be used for providing the radiation input face and the radiation exit face. In specific embodiments, the radiation exit face and the radiation input face are comprises by different faces of the light transmissive body (see further also below).

Hence, the light transmissive body, more especially the radiation input face thereof, is configured downstream of the first light source. Or, in other words, the light transmissive body, more especially the radiation input face thereof, is radiationally coupled with the first light source.

The terms "radiationally coupled" or "optically coupled" may especially mean that (i) a light generating element, such as a light source, and (ii) another item or material, are associated with each other so that at least part of the radiation emitted by the light transmissive body is received by the item or material. In other words, the item or material is configured in a light-receiving relationship with the light transmissive body. At least part of the radiation of light transmissive body will be received by the item or material. This may in embodiments be directly, such as the item or material in physical contact with the (light emitting surface of the) light transmissive body. This may in embodiments be via a medium, like air, a gas, or a liquid or solid light guiding material. In embodiments, also one or more optics, like a lens, a reflector, an optical filter, may be configured in the optical path between light transmissive body and item or material.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

Hence, the light transmissive body is especially transmissive for at least part of the light source light propagating from the radiation input face to the radiation exit face. Further, the light transmissive body is especially further configured to convert part of the light source light propagating through the light transmissive body into first luminescent material light. Light transmissive body are known in the art, such as e.g. described in WO2006/054203, which is incorporated herein by reference.

As indicated above, the light transmissive body is especially configured to convert part of the (first) light source light propagating through the light transmissive body into first luminescent material light having a first luminescent material light spectral power distribution differing from the first spectral power distribution of the first light source light. The first luminescent material light may especially be due to down conversion, see also above.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The generally rod shaped or bar shaped light transmissive body can have any cross-sectional shape, but in embodiments has a cross section the shape of a square, rectangle, round, oval, triangle, pentagon, or hexagon. The radiation exit window may especially have an angle unequal to 0° and unequal to 180° with the radiation input face, such as angle(s) of 90°. Further, in specific embodiments the radiation exit window has an angle unequal to 0° and unequal to 180° with one or more of the one or more side faces, such as angle(s) of 90°. Generally, the (ceramic or crystal) bodies are cuboid. In specific embodiments, the body may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a light transmissive body having a round cross section.

In (other) embodiments, the body further has a lateral dimensions width or length (W or L) or diameter (D) and a thickness or height (H). In embodiments, (i) D≥H or (ii) and W≥H and/or L≥H. The luminescent tile may be transparent or light scattering. In embodiments, the tile may comprise a ceramic luminescent material. In specific embodiments, L≤10 mm, such as especially L≤5 mm, more especially L≤3 mm, most especially L≤2 mm. In specific embodiments, W≤10 mm, such as especially W≤5 mm, more especially W≤3 mm, most especially W≤2 mm. In specific embodiments, H≤10 mm, such as especially H≤5 mm, more especially H≤3 mm, most especially H≤2 mm. In specific embodiments, D≤10 mm, such as especially D≤5 mm, more especially D≤3 mm, most especially D≤2 mm. In specific embodiments, the body may have in embodiments a thickness in the range 50 µm-1 mm. Further, the body may have lateral dimensions (width/diameter) in the range 100 µm-10 mm. In yet further specific embodiments, (i) D>H or (ii) W>H and W>H. Especially, the lateral dimensions like length, width, and diameter are at least 2 times, like at least 5 times, larger than the height.

In embodiments, the luminescent material is comprised by or provided as a (light transmissive) body. In embodiment, the luminescent material is comprised by or provided as (light transmissive) layer. The layer may in embodiments also be indicated as body. In specific embodiments, the light generating device comprises a luminescent body, wherein the luminescent body comprises the first luminescent material, and wherein the luminescent body is a ceramic body.

In embodiments, the (first) luminescent is comprised by a single crystal. In (other) embodiments, the (first) luminescent is comprised by a ceramic body. In yet other embodiments, the (first) luminescent is comprised by a polycrystalline material, such as a polycrystalline material layer. This may in embodiments be a powder layer or a compacted powder layer.

Light source light of one or more of the light sources may be provided to the first luminescent material in a transmissive configuration or a reflective configuration. When more than one light source is configured to provide light source light to the first luminescent material, the light source light of the two or more of the light sources may be provided to the first luminescent material in a transmissive configuration and a reflective configuration.

In embodiments, a dichroic filter may be configured between the first light source and the first luminescent material, i.e. downstream of the first light source and upstream of the first luminescent material. Alternatively or additionally, a dichroic filter may be configured between the second light source and the first luminescent material, i.e. downstream of the second light source and upstream of the first luminescent material. Alternatively or additionally, a dichroic filter may be configured between the third light source and the first luminescent material, i.e. downstream of the third light source and upstream of the first luminescent material. Alternatively or additionally, a dichroic filter may be configured between the fourth light source and the first luminescent material, i.e. downstream of the fourth light source and upstream of the first luminescent material. A dichroic filter may be applied to allow the light source light be transmitted by the dichroic filter and the first luminescent material light to be reflected back. In this way, first luminescent material light propagating in the direction of the first light source and/or the second light source may at least partly be reused. Hence, in an embodiment a dichroic filter may be configured between the first luminescent material and the optical element.

The dichroic filter and first luminescent material may have a non-zero distance, such as e.g. selected from the range of 0.01-10 mm. Without physical contact, especially at a distance of at least about 0.001 mm, there may be less light loss.

When there is no dichroic filter (or other optics), in embodiments the (first (and/or second)) light source may have a non-zero distance to the first luminescent material, such as e.g. selected from the range of 0.01-10 mm. Without physical contact, especially at a distance of at least about 0.001 mm, there may be less light loss. A non-zero distance may also allow different thermal pathways for the first light source and/or second light source and the first luminescent material.

One or more heat sinks may be configured in thermal contact with one or more of the first light source, the second light source, the third light source, the fourth light source, and the first luminescent material.

As indicated above, the light generating device may further comprise control system configured to control the first light source (light), the second light source (light), and the third light source (light). In specific embodiments, the control system is configured to control one or more optical properties of the device light, especially in further embodiments in dependence of a user interface, a sensor signal, and a timer. In specific embodiments, the one or more optical properties include the correlated color temperature and the color rendering index.

In embodiments, in an operational mode of the light generating device, the light generating device is configured to generate white device light having a CRI of at least 70, a correlated color temperature selected from the range of 2500-7000 K, such as 2500-6500 K. As indicated above, the control system may be configured to control the correlated color temperature by controlling the second light source. In yet further embodiments, the control system is configured to control the first light source, the second light source, the third light source and the fourth light source. Especially, the control system may be configured to keep in a controlling mode the color rendering index over 75 and the correlated color temperature within the range of 2500-6500 K, such as 2700-6500 K. A user may select a CRI value and/or a CCT value, and the control system may define the spectral power distribution of the device light.

In embodiments, a total contribution of the second light source light relative to a total power in Watt of the white device light may be selected from the range of 0-20%, such as in the range of 0-15%, like at least 0.5%. A total contribution of the third light source light relative to the total power in Watt of the white device light may be selected from the range of 4-55%, such as 5-50%. A total contribution of the fourth light source light relative to the total power in Watt of the white device light may be selected from the range of 1-45%, such as 2-40%. A total contribution of the luminescent material light relative to the total power in Watt of the white device light may be selected from the range of 30-80%, such as 35-75%. Here, the term "luminescent material light" may refer to first luminescent material light and optional second luminescent material light (see further also above). Especially, a total contribution of the first luminescent material light relative to the total power in Watt of the white device light may be selected from the range of 30-70%, such as 35-65%. When the device light is not white, the contributions may be different.

The luminous efficiency of the device (light) may be selected from the range of 290-370 Lm/W, such as 300-360 Lm/W.

In embodiments, the light generating device is configured to provide the luminescent light with power emitted from the exit surface of the luminescent converter having a power density of 4 W/mm$^2$, especially a power density at least 7 W/mm$^2$, more especially at least 9 W/mm$^2$, even more especially at least 13W/mm$^2$. Hence, in embodiments in an operational mode of the light generating device, the light generating device is configured to generate the luminescent material light from a radiation exit surface (or radiation exit face) of the luminescent converter with a power density of at least 4 W/mm$^2$. In yet further specific embodiments, the lighting device may be configured to provide luminescent light in combination with blue and/or red laser light coming out the same surface as the luminescent light providing white light with a brightness of at least 2000 lm/mm$^2$, more especially at least 3000 lm/mm$^2$, even more especially at least 6000 lm/mm$^2$ Herein, "lm" refers to lumen.

In yet a further aspect, the invention also provides a luminaire comprising the light generating device as defined herein. The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

The term "white light" and similar terms herein, is known to the person skilled in the art. It especially relates to light having a correlated color temperature (CCT) between about 1800 K and 20000 K, like at least about 2000 K, especially in the range of 2700-20000 K, for general lighting especially in the range of about 2000-6700 K, such as 2700-6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
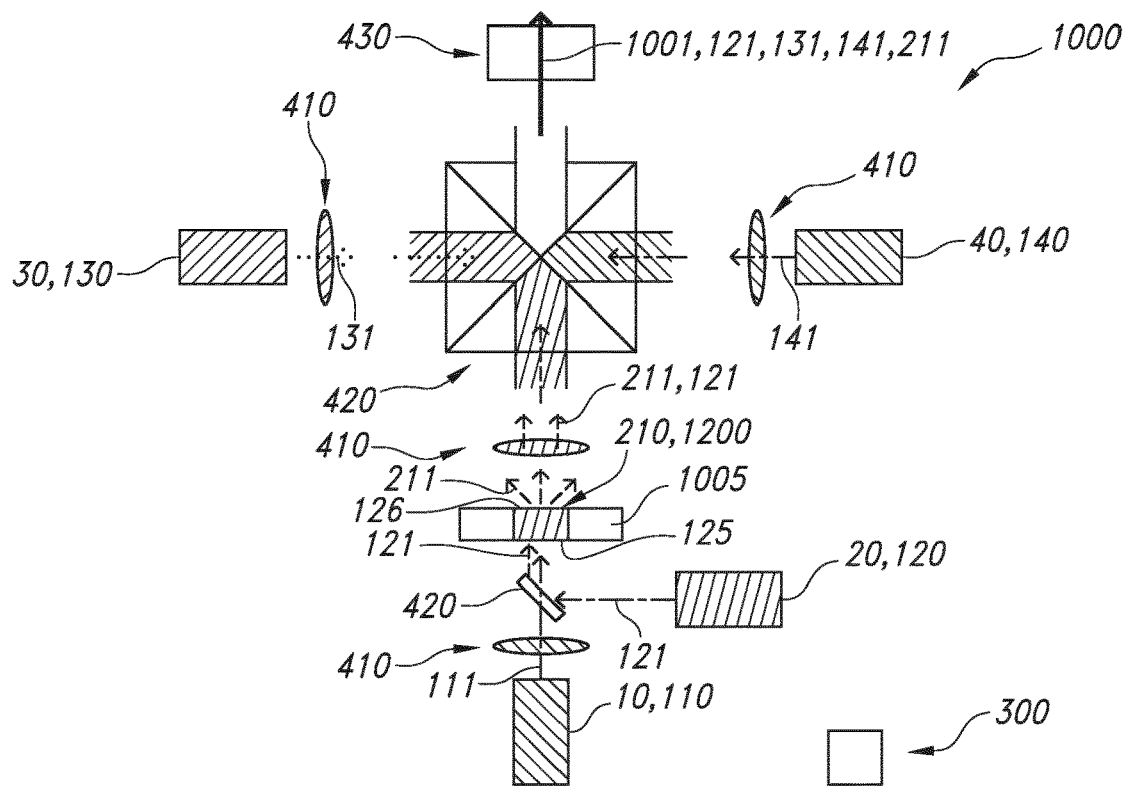
FIGS. 1a-1c schematically depict some possible embodiments.
Figure 1B:
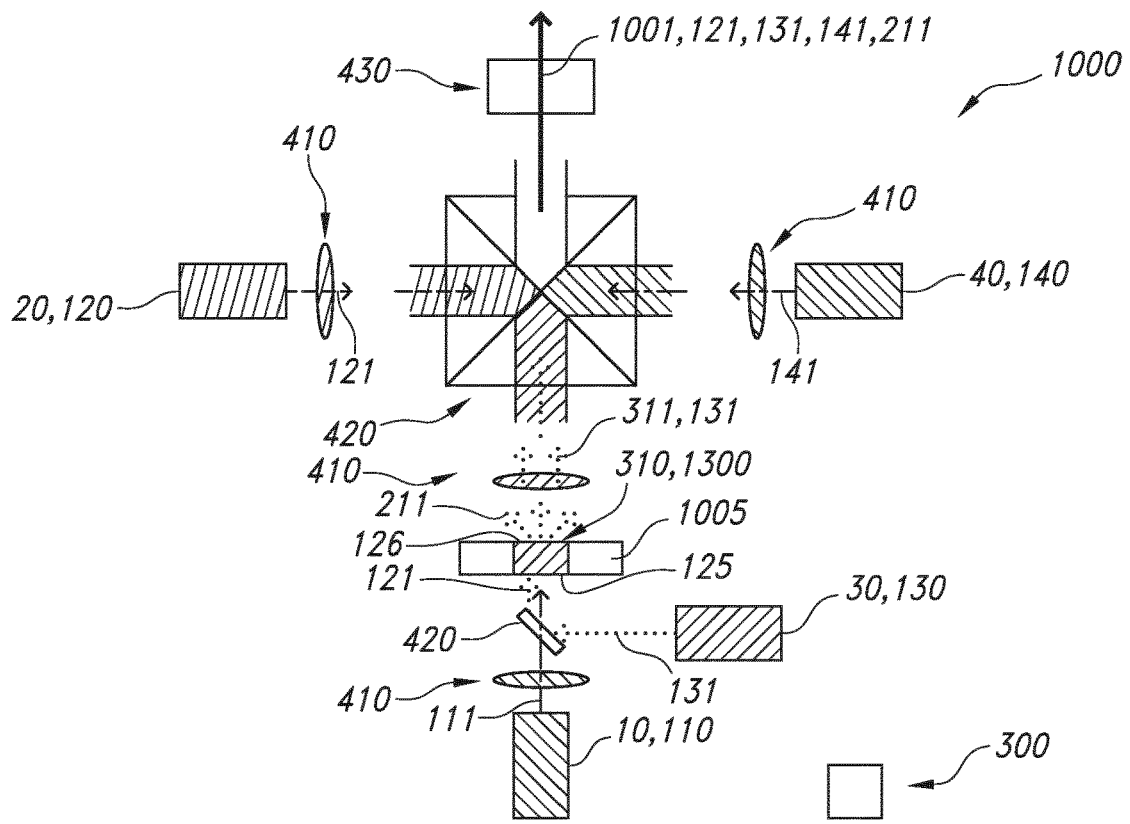
Figure 1C:
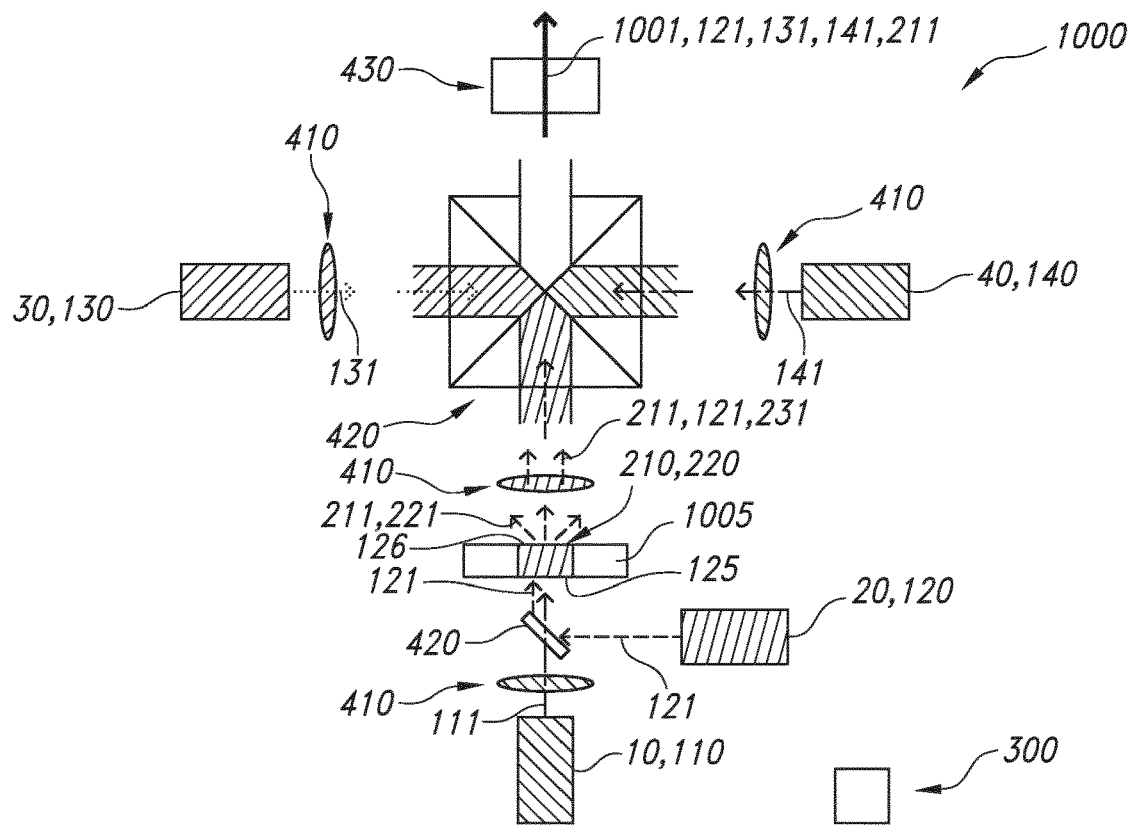

FIGS. 1a-1c schematically depict some possible embodiments of a light generating device 1000 configured to generate device light 1001. Especially, the light generating device 1000 comprises a first light source 110 configured to generate UV and/or blue first light source light 111. In embodiments, the first light source 110 is a first laser light source 10. The first light source light 111 may have a peak maximum $\lambda_1$, wherein $\lambda_1$ is selected from the range of 400-480 nm, though in the range of 200-400 nm, such as 300-400 nm, like 300-380 nm, may also be possible. Further, the device 1000 comprises a second light source 120 configured to generated green second light source light 121. Especially, the second light source 120 is a second laser light source 20. Further, in embodiments the green second light source light 121 has a second peak maximum $\lambda_2$ selected from the range of 545-565 nm. The device 1000 may further comprise a third light source 130 configured to generate red third light source light 131. Especially, the third light source 130 is a third laser light source 30. The third light source light 131 may have a peak maximum $\lambda_3$, wherein $\lambda_3$ is selected from the range of 630-650 nm. For instance, (another) optical element 420 may be applied to introduce the third light source light 131. Also this optical element 420 may e.g. be a dichroic mirror or dichroic combiner. As shown, the third light source light 131 bypasses the luminescent material 210 (see further below). The light generating device 1000 may further comprise a fourth light source 140. Especially, the fourth light source 140 is a fourth laser light source 40. The fourth light source 140 is configured to generate fourth light source light 141, especially in the blue. In further, in embodiments the blue fourth light source light 141 has a second peak maximum $\lambda_2$ selected from the range of 450-480 nm. As shown, the fourth light source light 141 bypasses the luminescent material 210 (see further below).

In specific embodiments, the first light source light 111 may have a peak maximum $\lambda_1$, wherein $\lambda_1$ is selected from the range of 400-480 nm, wherein the second light source light 121 may have a second peak maximum $\lambda_2$ selected from the range of 545-565 nm, wherein the third light source light 131 may have a peak maximum $\lambda_3$, wherein $\lambda_3$ is selected from the range of 630-650 nm, and wherein the fourth light source light 141 may have a peak maximum $\lambda_4$, wherein $\lambda_4$ is selected from the range of 450-480 nm.

Focusing may be executed with one or more optics, like (focusing) lenses. Especially, two lenses may be applied to focus the laser light source light. Collimation may be executed with one or more (other) optics, like collimation elements, such as lenses and/or parabolic mirrors. References 410 indicate optics that may be used for focusing and/or collimation. Though a single lens is depicted, other types of lenses, a plurality of lenses, may also be applied, as reference 410 indicate optics, especially focusing and/or collimation optics, in general, especially the optics 410 may comprise focusing optics.

Yet further, the device 1000 especially may comprise the first luminescent material 210 configured to convert at least part of the first light source light 111 into first luminescent material light 211. The luminescent material light 211 may have an emission band having wavelengths in one or more of the green spectral wavelength range and the yellow spectral wavelength range. Especially, the first luminescent material 210 may comprise a luminescent material of the type $A_3B_5O_{12}$:Ce, wherein A comprises one or more of Y, La, Gd, Tb and Lu, especially (at least) one or more of Y, Gd, Tb and Lu, and wherein B comprises one or more of Al, Ga, In and Sc. In specific embodiments, A comprises at least one or more of Y, Gd, and Lu, and wherein B comprises at least Al.

As indicated above, the luminescent material 210 may comprise $Y_{x1-x2-x3}A'_{x2}Ce_{x33}Al_{y1-y2}B'_{y25}O_{12}$, wherein x1+x2+x3=1, wherein x3>0, wherein 0<x2+x3≤0.2, wherein y1+y2=1, wherein 0≤y2≤0.2, wherein A' comprises one or more elements selected from the group consisting of lanthanides, and wherein B comprises one or more elements selected from the group consisting of Ga, In and Sc.

At maximum 10% of B—O may be replaced by Si—N; B—O may thus comprise B'—O. Especially, x3 is selected from the range of 0.001-0.1, wherein 0<x2+x3≤0.1, and wherein 0≤y2≤0.1. Especially, x3 is selected from the range of 0.001-0.1, wherein 0<x2+x3≤0.1, and wherein 0≤y2≤0.1. As indicated above, in embodiments x1>0.

In specific embodiments, see also above, the light generating device 1000 comprises luminescent material, wherein at least 95 weight % of the luminescent material comprises $(Y_{x1-x2-x3}A'_{x2}Ce_{x3})_3(Al_{y1-y2}B'_{y2})_5O_{12}$. Hence, essentially all luminescent material light comprised by the device light 1001 may be based on this $(Y_{x1-x2-x3}A'_{x2}Ce_{x3})_3(Al_{y1-y2}B'_{y2})_5O_{12}$ luminescent material.

In specific embodiments, the first luminescent material light 211 has a first dominant wavelength $\lambda_{d1}$ selected from the range of 555-580 nm.

Reference 125 indicates a radiation input face and reference 126 indicates a radiation exit face.

Referring to FIG. 1a, the second light source 120 may be configured upstream of the first luminescent material 210. Hence, the luminescent material 210 may be transmissive for the second light source light 121. Further, the third light source 130 is configured to generate the third light source light 131 that bypasses the first luminescent material 210. In FIG. 1b, however, second light source 120 and the third light source 130, are by way of example, swapped. Here, the third light source 130 is not configured to generate the third light source light 131 that bypasses the first luminescent material 210. In FIG. 1b, the luminescent material 210 is transmissive for the third light source light 131.

For cooling the first luminescent material 210 a heat sink may be applied, which is indicated with reference 1005. One or more heat sinks may be thermally coupled with one or more of the light sources 110, 120, 130, 140 and/or with the luminescent material 210.

The light generating device 1000 may be configured to combine and/or homogenize the second light source light 121 and the first luminescent material light 211 (downstream of the first luminescent material 210). For instance, optical elements 420 may be applied to introduce the second light source light 121 and/or the third light source light 131 and/or the fourth light source light 141. Optical element 420 may e.g. be a dichroic mirror or dichroic combiner. Optical element 420 may also be a combination of a plurality of dichroic mirrors or dichroic combiners. The device 1000 further optionally comprises an optical element 430 configured to combine and/or homogenize optionally unconverted first light source light 111, the second light source light 121, the third light source light 131, the fourth light source light 141, and the first luminescent material light 211, to provide device light 1001. In specific embodiments, the optical element 430 may comprises one or more of (i) a dichroic beam combiner and (ii) an optical homogenizer. The optical element 430 may alternatively or additionally be configured to beam shape the device light 1001 and/or configured to homogenize the device light 1001. As schematically depicted the optical element 430 is configured downstream of the first luminescent material 210. For instance, the optical element 430 may comprise a CPC like optical element. The optical element 430 may include one or more of reflective and transmissive optics. In the schematic drawings, transmissive optics are schematically depicted, but this should not be interpreted as being limited to transmissive optics.

The device 1000 further comprises in embodiments a control system 300 configured to control the second light source 120 and/or one or more of the other light sources 110, 130, and 140. Especially, the control system 300 is configured to control the second light source 120, the third light source 130 and the fourth light source 140, and in general also the first light source 110.

In an operational mode of the light generating device 1000, the light generating device 1000 may be configured to generate white device light 1001 having a CRI of at least 70, a correlated color temperature selected from the range of 2500-7000 K. Especially, in embodiments a total contribution of the second light source light 121 relative to a total power in Watt of the (white) device light 1001 may be selected from the range of 0-20%. The control system 300 may be configured to control the correlated color temperature by controlling the second light source 120 and/or one or more of the other light sources 110, 130, and 140. Hence, yet further the control system 300 may be configured to control the first light source 110, the second light source 120, and the third light source 130. In specific embodiments, the control system 300 may be configured to keep in a controlling mode the color rendering index over 75 and the correlated color temperature within the range of 2500-6500 K.

In an operational mode of the light generating device 1000, the light generating device 1000 is configured to generate the device light 1001 with a brightness of at least 2000 lm/mm$^2$.

FIG. 1c is essentially the same as FIG. 1a. However, here the first luminescent material 210 and a second luminescent material 220 are applied. They may e.g. be combined in a single body. However, other embodiments with multilayers, or even yet other embodiments similar to the introduction of the other colors, may be applied. The second luminescent material 220 is configured to generate second luminescent material light 221. This may e.g. be red or orange second luminescent material light 221. This may (further) increase the CRI.

Referring to FIGS. 1a-1c, alternatively also reflective configurations may be applied.

Figure 2:
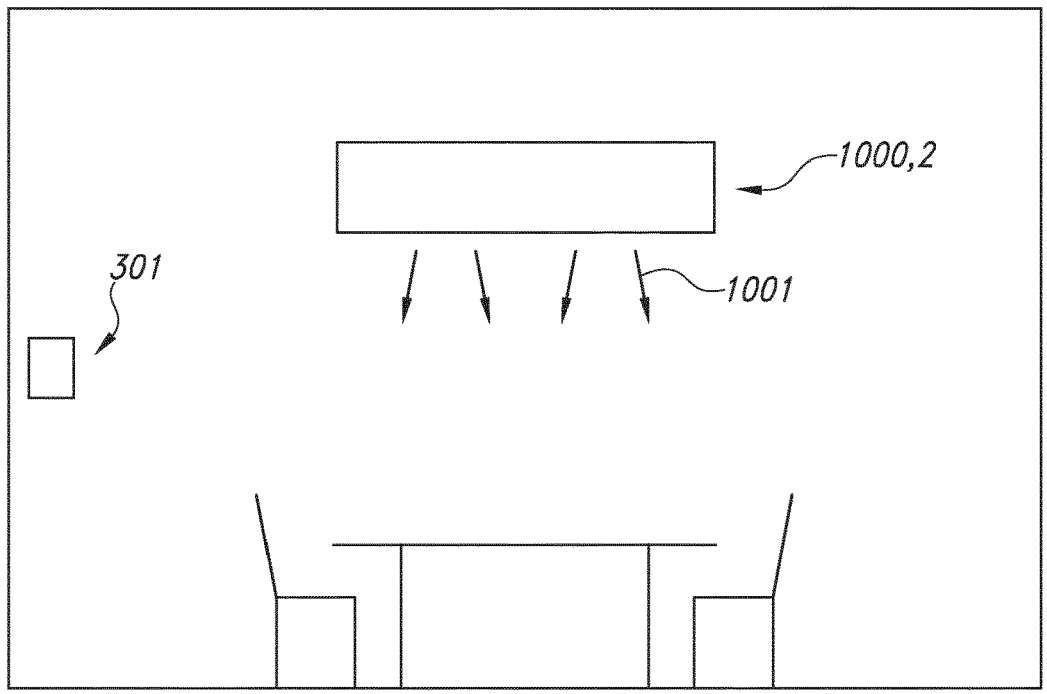
FIG. 2 schematically depicts a further embodiment.

FIG. 2 schematically depicts an embodiment of a luminaire 2 comprising the light generating device 1000 as described above. Reference 301 indicates a user interface which may be functionally coupled with the control system (not depicted) comprised by or functionally coupled to the lighting system 1000.

Figure 3:
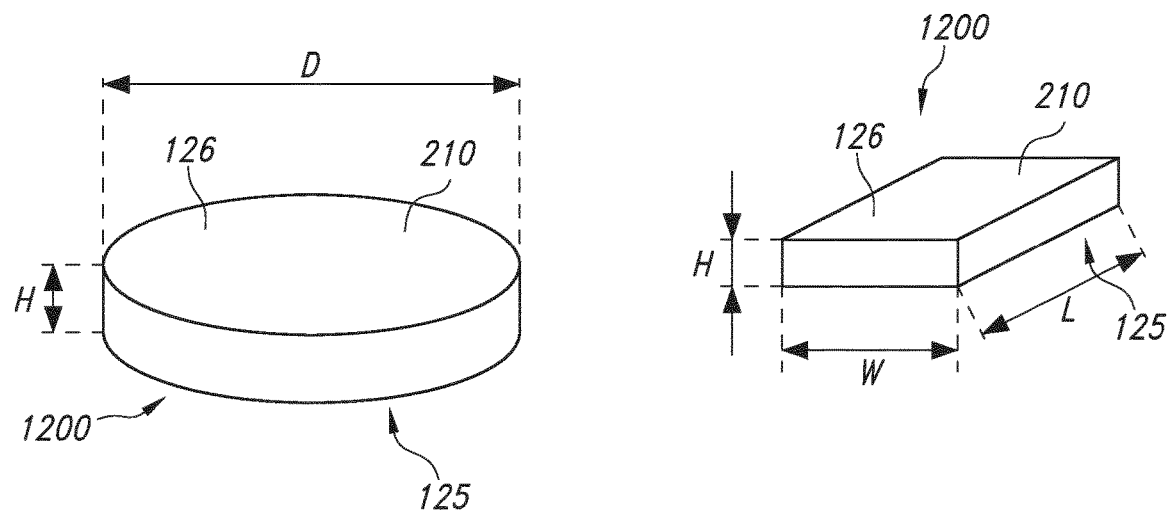
FIG. 3 schematically depicts some embodiments of the luminescent material (body)

FIG. 3 schematically depict some embodiments of the luminescent material 210. Here, embodiments are depicted wherein the luminescent material is provided as body 1200 (see also above). The height is indicated with reference H, the width with reference W, the length with reference L, and the diameter with reference D. Note that in embodiments the body 1200 may also comprise two or more luminescent materials, such as the first luminescent material 210 and the second luminescent material 220. Hence, optionally reference 210 may also be interpreted as the first luminescent material 210 and the second luminescent material 220.

Hence, amongst others it is proposed to use green/yellow emission (phosphor pumped by blue light) in combination with red and blue laser emission to obtain white light and change the color temperature of this light using a green laser (see FIGS. 1a-1c). Amongst others, it is suggested to use high lumen equivalent green laser source with dominant wavelength in the range from 545 nm to 565 nm. When the system is configured so that the maximum power of green laser emission is varied in a range from 0 to 15% (or 0-20%) with respect to the total power (of the white device light), essentially any color temperature in the range from 2700 K to 6500-K on BBL with high CRI can be obtained (see Tables below).

Figure 4A:
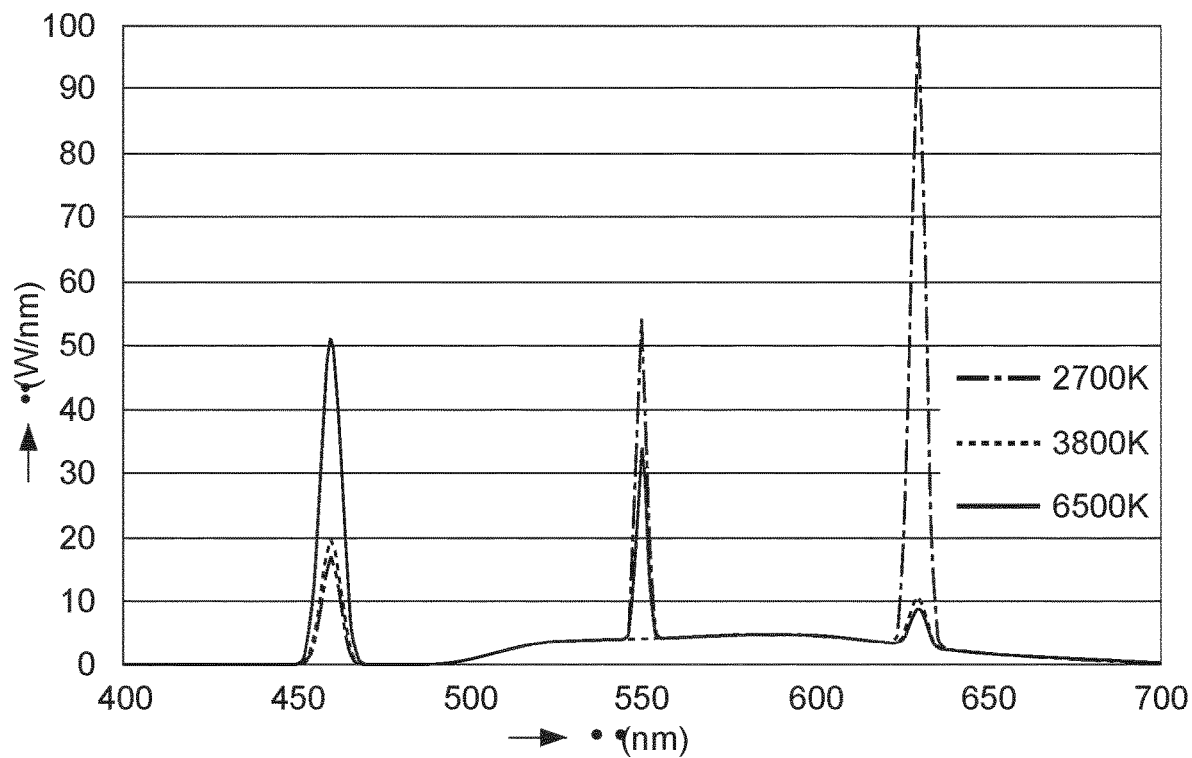
FIGS. 4a-4b display some results. The schematic drawings are not necessarily to scale.

In an example, the power emitted by the phosphors (0.4% Ce YAG+orange luminescent material) constant and moved along the BBL to change the CCT from 2700K to 6500 K by changing red green and blue phosphor emissions. Result for three different CCTs are shown in FIG. 4a and Table 1:

|  | Ex1 | Ex2 | Ex3 |
| --- | --- | --- | --- |
| CCT(K) | 2700 | 4000 | 6500 |
| CRI | 78 | 80 | 74 |
| R9 | 19 | 12 | 27 |
| LE (Lm/W) | 334 | 343 | 311 |
| Red 630 nm % | 36 | 5 | 3 |
| Green 550 nm % | 12 | 0 | 9 |
| Blue 460 nm % | 8 | 17 | 32 |
| YAG phosphor % | 31 | 56 | 40 |
| Orange phosphor % | 12 | 22 | 16 |

Figure 4B:
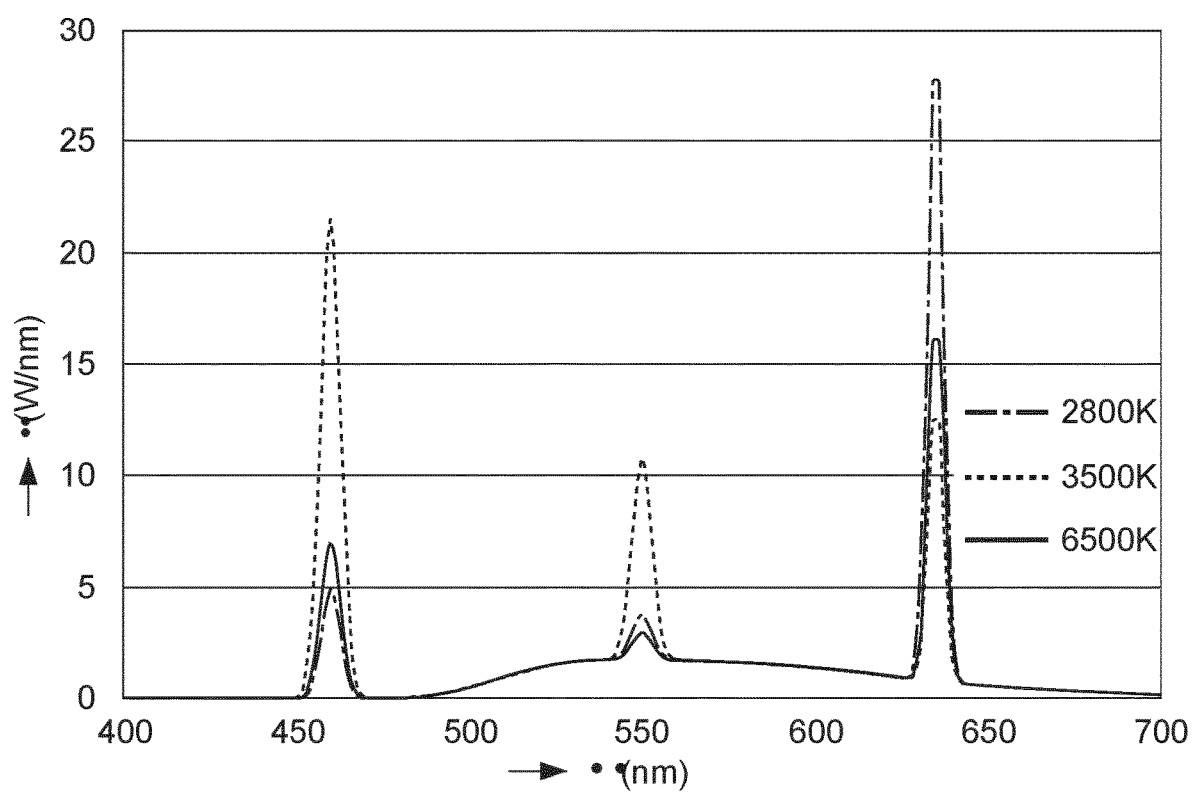

Similar results were generated in a further example, essentially without the second luminescent material. Result for three different CCTs are shown in FIG. 4b and Table 2.

Here, the power emitted by the phosphor (1% Ce YAG) was kept constant and the CCT was moved along the BBL from 2700K to 6500 K by changing red green and blue phosphor emissions. Results for 3 different CCTs are shown in FIG. 4b and Table 2:

|  | Ex4 | Ex5 | Ex6 |
|---|---|---|---|
| CCT(K) | 2800 | 3500 | 6500 |
| CRI | 77 | 87 | 76 |
| R9 | −10 | 40 | 47 |
| LE (Lm/W) | 308 | 321 | 303 |
| Red 635 nm % | 36 | 24 | 15 |
| Green 550 nm % | 4 | 2 | 15 |
| Blue 460 nm % | 8 | 14 | 30 |
| YAG phosphor % | 52 | 60 | 40 |

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device configured to generate device light, wherein the light generating device comprises:
   a first light source configured to generate one or more of UV and blue first light source light, wherein the first light source is a first laser light source;
   a second light source configured to generated green second light source light, wherein the second light source is a second laser light source;
   a third light source configured to generate red third light source light, wherein the third light source is a third laser light source;
   a fourth light source configured to generate blue fourth light source light, wherein the fourth light source is a fourth laser light source;
   a first luminescent material configured to convert at least part of the first light source light into first luminescent material light having an emission band having wavelengths in one or more of (a) a green spectral wavelength range and (b) a yellow spectral wavelength range, wherein the first luminescent material comprises a luminescent material of a type $A_3B_5O_{12}$:Ce, wherein A comprises one or more of Y, La, Gd, Tb and Lu, and wherein B comprises one or more of Al, Ga, In and Sc;
   an optical element configured to combine (i) optionally unconverted first light source light, (ii) the second light source light, (iii) the third light source light, (iv) the fourth light source light, and (v) the first luminescent material light, to provide device light, wherein the light generating device is configured to provide in an operational mode white device light comprising at least the luminescent material light and the fourth light source light;
   a control system configured to control one or more of the first light source, the second light source, the third light source, and/or the fourth light source; and
   wherein the fourth light source is configured to generate the fourth light source light that bypasses the first luminescent material, and wherein one or more of the second light source and the third light source are configured upstream of the first luminescent material.

2. The light generating device according to claim 1, wherein the first light source light has a peak maximum $\lambda_1$, wherein $\lambda_1$ is selected from a range of 400-480 nm, wherein the second light source light has a second peak maximum $\lambda_2$ selected from a range of 545-565 nm, wherein the third light source light has a third peak maximum $\lambda_3$, wherein $\lambda_3$ is selected from a range of 630-650 nm, and wherein the fourth light source light has a fourth peak maximum $\lambda_4$, wherein $\lambda_4$ is selected from a range of 450-480 nm.

3. The light generating device according to claim 1, wherein the luminescent material comprises $(Y_{x1-x2-x3}A'_{x2}Ce_{x3})_3(Al_{y1-y2}B'_{y2})_5O_{12}$, wherein x1+x2+ x3=1, wherein x3>0, wherein 0<x2+x3≤0.2, wherein y1+y2=1, wherein 0≤y2≤0.2, wherein A' comprises one or more elements selected from a group consisting of lanthanides, wherein B comprises one or more elements selected from a group consisting of Ga, In and Sc; and wherein the first luminescent material light has a first dominant wavelength ($\lambda_{d1}$) selected from a range of 555-580 nm.

4. The light generating device according to claim 3, wherein x3 is selected from a range of 0.001-0.1, wherein 0<x2+x3≤0.1, and wherein 0≤y2≤0.1.

5. The light generating device according to claim 1, wherein in an operational mode of the light generating device, the light generating device is configured to generate the white device light having a CRI of at least 70, a correlated color temperature selected from a range of 2500-7000 K, and wherein a total contribution of the second light source light relative to a total power in Watt of the device light is selected from a range of 0-20%.

6. The light generating device according to claim 5, wherein the control system is configured to control the correlated color temperature by controlling the second light source, the third light source, and the fourth light source.

7. The light generating device according to claim 5, wherein the control system is configured to keep in a controlling mode a color rendering index over 75 and the correlated color temperature within the range of 2500-6500 K.

8. The light generating device according to claim 1, wherein in an operational mode of the light generating device, the light generating device is configured to generate the luminescent material light from an exit surface of the luminescent converter with a power density of at least 4 W/mm$^2$.

9. The light generating device according to claim 1, wherein the optical element comprises one or more of (i) a dichroic beam combiner and (ii) an optical homogenizer.

10. The light generating device according to claim 1, wherein the second light source is configured upstream of the first luminescent material, and wherein the third light source is configured to generate the third light source light that bypasses the first luminescent material.

11. The light generating device according to claim 1, wherein the second light source and the third light source are configured upstream of the first luminescent material.

12. The light generating device according to claim 1, wherein the first luminescent material is transmissive for one or more of (i) at least part of the second light source light, and (ii) at least part of the third light source light.

13. The light generating device according to claim 1, comprising a luminescent body, wherein the luminescent body comprises the first luminescent material, and wherein the luminescent body is a ceramic body.

14. The light generating device according to claim 1, further comprising a second luminescent material configured to convert part of one or more of the first light source light and second light source light into second luminescent material light, wherein the optical element is configured to combine (i) optionally unconverted first light source light, (ii) the second light source light, (iii) the third light source light, (iv) the fourth light source light, (v) the first luminescent material light, and (vi) the second luminescent material light to provide device light.

15. A luminaire comprising the light generating device according to claim 1.

* * * * *